United States Patent

[11] 3,625,837

[72] Inventors Carl W. Nelson
Palo Alto;
John F. Hinchey, Los Altos, both of Calif.
[21] Appl. No. 860,848
[22] Filed Sept. 18, 1969
[45] Patented Dec. 7, 1971
[73] Assignee The Singer Company

[54] ELECTROPLATING SOLDER-BUMP CONNECTORS ON MICROCIRCUITS
6 Claims, 13 Drawing Figs.

[52] U.S. Cl. .......... 204/15, 29/576, 204/43, 204/297 R
[51] Int. Cl. .......... C23b 5/48, C23b 5/32, C23b 5/70
[50] Field of Search .......... 204/15; 117/212; 29/577, 576

[56] References Cited
UNITED STATES PATENTS

| | | | |
|---|---|---|---|
| 3,401,055 | 9/1968 | Langdon et al. | 117/212 |
| 3,408,271 | 10/1968 | Reissmueller et al. | 204/15 |
| 3,449,825 | 6/1969 | Loro | 29/578 |
| 3,460,003 | 8/1969 | Hampikian et al. | 117/212 |
| 3,462,349 | 8/1969 | Gorgenyi | 204/15 |
| 3,528,892 | 9/1970 | Mazur | 204/15 |

OTHER REFERENCES

The Effect of Board Thickness to Hole Diameter Ratio on Plating of Printed Circuits by B. F. Rothschild, Plating, April 1966, pgs. 437- 440

Electroplating and Metalizing Printed Wiring by Joseph Dytrt, Industrial and Engineering Chemistry, Vol. 51, No. 3, March 1959, pgs. 286- 287

*Primary Examiner*—John H. Mack
*Assistant Examiner*—T. Tufariello
*Attorneys*—Patrick J. Schlesinger, Charles R. Lepchinsky and Jay M. Cantor

ABSTRACT: A silicon wafer containing 100 to 300 microcircuits is coated with a patterned layer of glass and then a conducting layer of chromium and copper which connects, through openings in the glass, to circuit terminals and also to the silicon substrate at the scribe positions. A patterned photoresist then exposes only the terminal areas. An electroplating connection to the silicon substrate provides uniform, low-resistance current paths through the metallization at the scribe positions to the plating sites over the terminal positions for the electrodeposition of soldier.

INVENTORS
Carl W. Nelson
John F. Hinchey
BY
ATTORNEY

ELECTROPLATING SOLDER-BUMP CONNECTORS ON MICROCIRCUITS

CROSS-REFERENCE TO RELATED APPLICATIONS

This invention is an improvement of the process described and claimed in our copending U.S. patent application entitled "Method of Making Solder-Bump Interconnects for Microcircuits," Ser. No. 858,692, filed Sept. 17, 1969

BACKGROUND OF THE INVENTION

1. Field of the Invention

This invention relates to the manufacture of microcircuits, and more particularly to the formation of solder-bump connectors on terminal areas of microcircuit chips.

2. Description of the Prior Art

J. L. Langdon, C. Karan, R. P. Pecoraro, and P. A. Totta in U.S. Pat. No. 3,401,055, filed Sept. 10, 1968, describe the formation of solder-bump connectors on microcircuit chips by projecting a vapor of tin-lead solder in vacuum through an apertured mask spaced from the circuit chip onto the surface of the chips, and by then melting the solder to permit surface tension to contract it into rounded bumps.

SUMMARY OF THE INVENTION

For electroplating solder onto the terminal areas as described in our copending application, distributed electric connections are provided between the silicon, or semiconductor, substrate of a wafer and the layer of bonding metal, to provide uniform, low-resistance paths from the substrate to plating sites over the microcircuit terminals. Preferably, such connections are provided at the scribe lines between the chips-to-be.

Objects of our invention include the provision of a new and improved method of forming connectors on microcircuit devices, a new method of depositing solder for the formation of solder-bump connectors, and a new method of electroplating on a microcircuit device.

DESCRIPTION OF THE DRAWINGS

These and other objects and advantages will be apparent from the following description of one embodiment of our invention, taken in connection with the accompanying drawings, wherein.

DESCRIPTION OF THE PREFERRED EMBODIMENT

Figure 1:
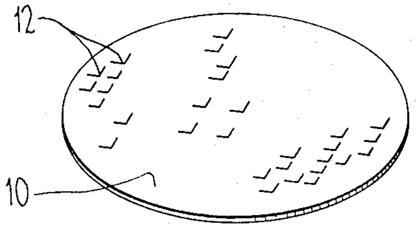
FIG. 1 is a pictorial view of a silicon wafer on which a plurality of microcircuits are formed.
Figure 2:
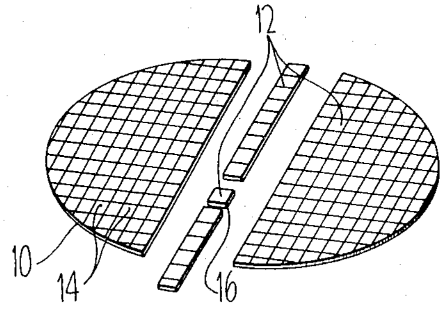
FIG. 2 is a view similar to FIG. 1 showing the breaking of the waver into circuit chips or dice.

FIG. 1 represents a thin wafer 10 of known construction, for example, 0.010 inch thick and 1 inch in diameter, cut from a crystal of silicon, or semiconductor. A plurality of individual microcircuits 12 are formed in a rectangular pattern on the upper surface of wafer 10. Thereafter, as indicated in FIG. 2, the silicon substrate of wafer 10 is scribed, or scored, along lines 14 and then broken, or divided, along the scribe lines into chips, or dice 16, each of which carries one of the microcircuits 12. Typically, all the microcircuits on a single wafer are duplicates of each other.

Figure 3:
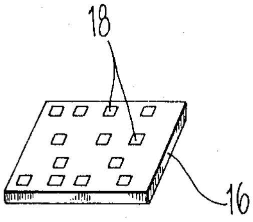
FIG. 3 is an enlarged view of a circuit chip.

A single chip, or die, 16 is represented, enlarged, in FIG. 3. Such a chip may be, for example, 0.060×0.100 inch, carry as many as two or 300 elements such as transistors, diodes, and resistors, and have from three to 100 aluminum terminals 18 on its active planar surface, each terminal about 0.005 inch square. Details of the microcircuits, other than the terminals 18, are omitted.

Figure 4:
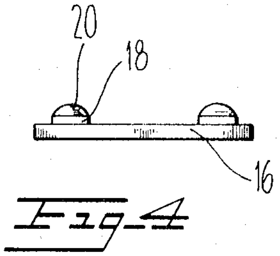
FIG. 4 is an elevational view of a circuit chip with solder-bump connectors.

As described by L. F. Miller in U.S. Pat. No. 3,429,040, filed Feb. 25, 1969, in one method of assembling such chips 16 onto a carrier module 26 and connecting them into larger circuits thereon, each such terminal 18 is provided with a quantity of solder which, when melted, is drawn by surface tension into s hemispherical, or rounded, bump 20, as represented in FIG. 4. Although FIGS. 3 and 4 show an individual chip 16, the solder bumps 20 are preferably applied to the intact wafer 10.

Figure 5:
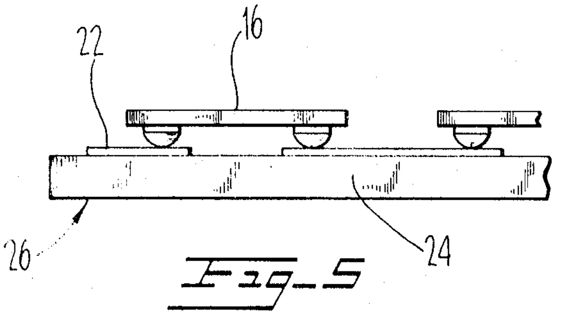
FIG. 5 is an elevational view showing ships placed on a carrier module.
Figure 6:
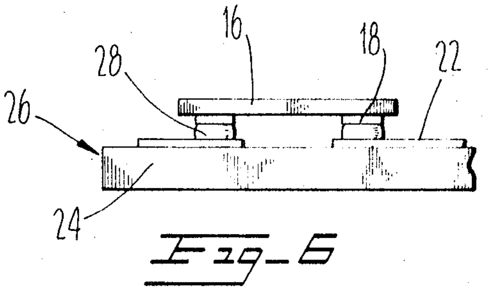
FIG. 6 is a view similar to FIG. 5 showing the form taken by the solder in bonding and electrically connecting the chip to the carrier module.

As represented in FIG. 5, with the bumps 20 solidified, the chips 16 are set, face down, in place on conductors 22 on the surface of the substrate 24 of a carrier module 26. Then the assemblage is heated to melt the solder-bumps 20, which thereupon wet, and bond to, the conductors 22. The individual terminal areas 18 of the chip 16 are surrounded by nonsolderable material, such as a silicate glass. Similarly, the solderable areas of the conductors 22 on the carrier module 26 are surrounded by nonsolderable material, such as a silicate glass, passivated chromium, or a polyimide resin. Accordingly, surface tension holds the liquid solder in compact columns on these solderable areas and, in so doing, supports the weight of the chip 16. Upon cooling, the solder solidifies as standoffs 28 that supports the chips 16 slightly spaced from the surface of the carrier module 26, FIG. 6.

In all views, certain dimensions are exaggerated and certain details are omitted for facilitating the description. In particular, in the actual device, the solder-bumps 20 must contain a larger quantity of metal, and so must be much thicker, than the terminals 18.

Our present invention provides a new and improved method of electroplating solder onto the terminal areas, such as the terminals 18 for forming solder-bump connectors such as connectors 20, FIG. 4.

Figure 7:
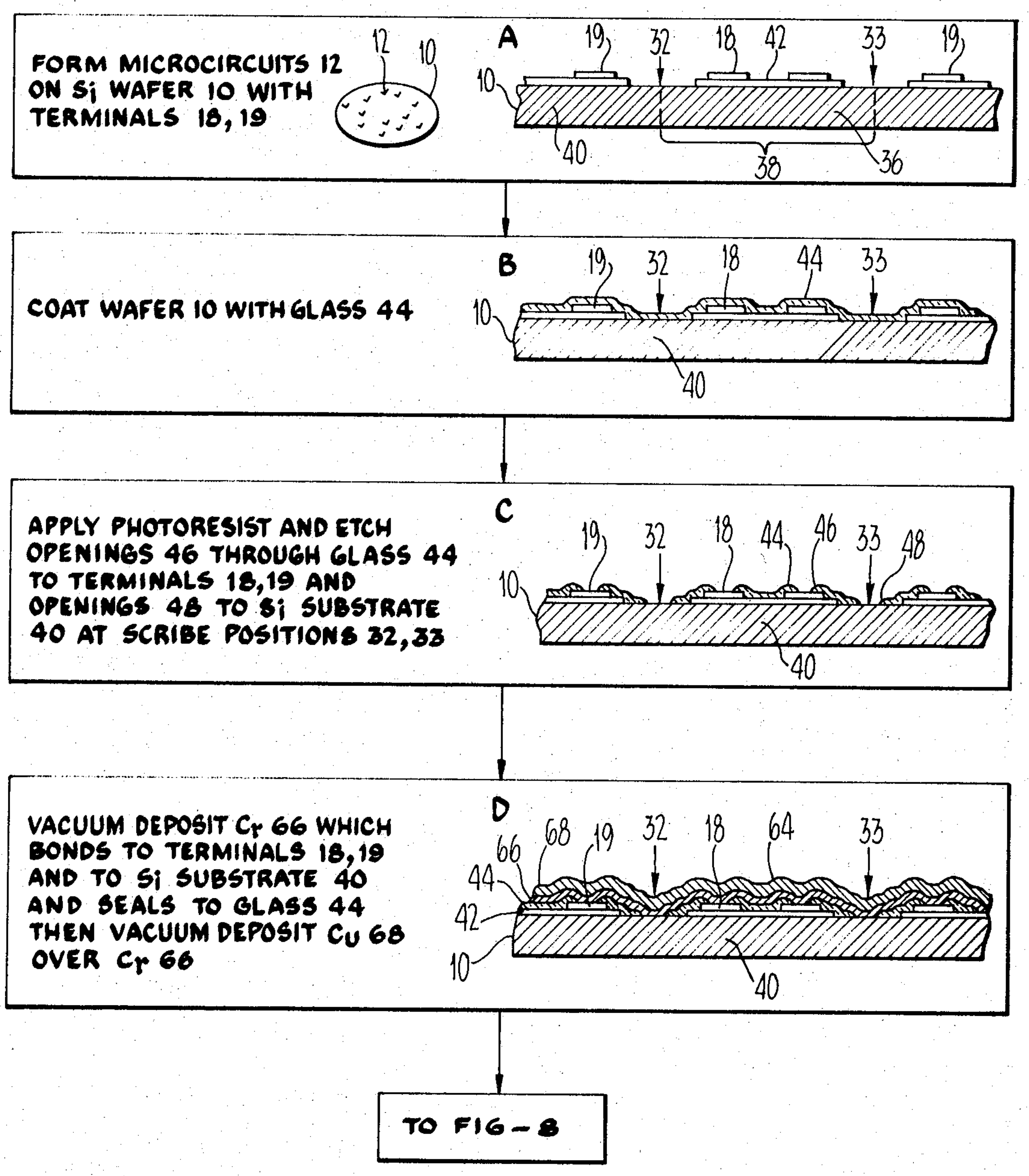
FIGS. 7 and 8 together constitute a flow diagram of the process of electroplating solder-bump connectors according to the present invention.
Figure 8:
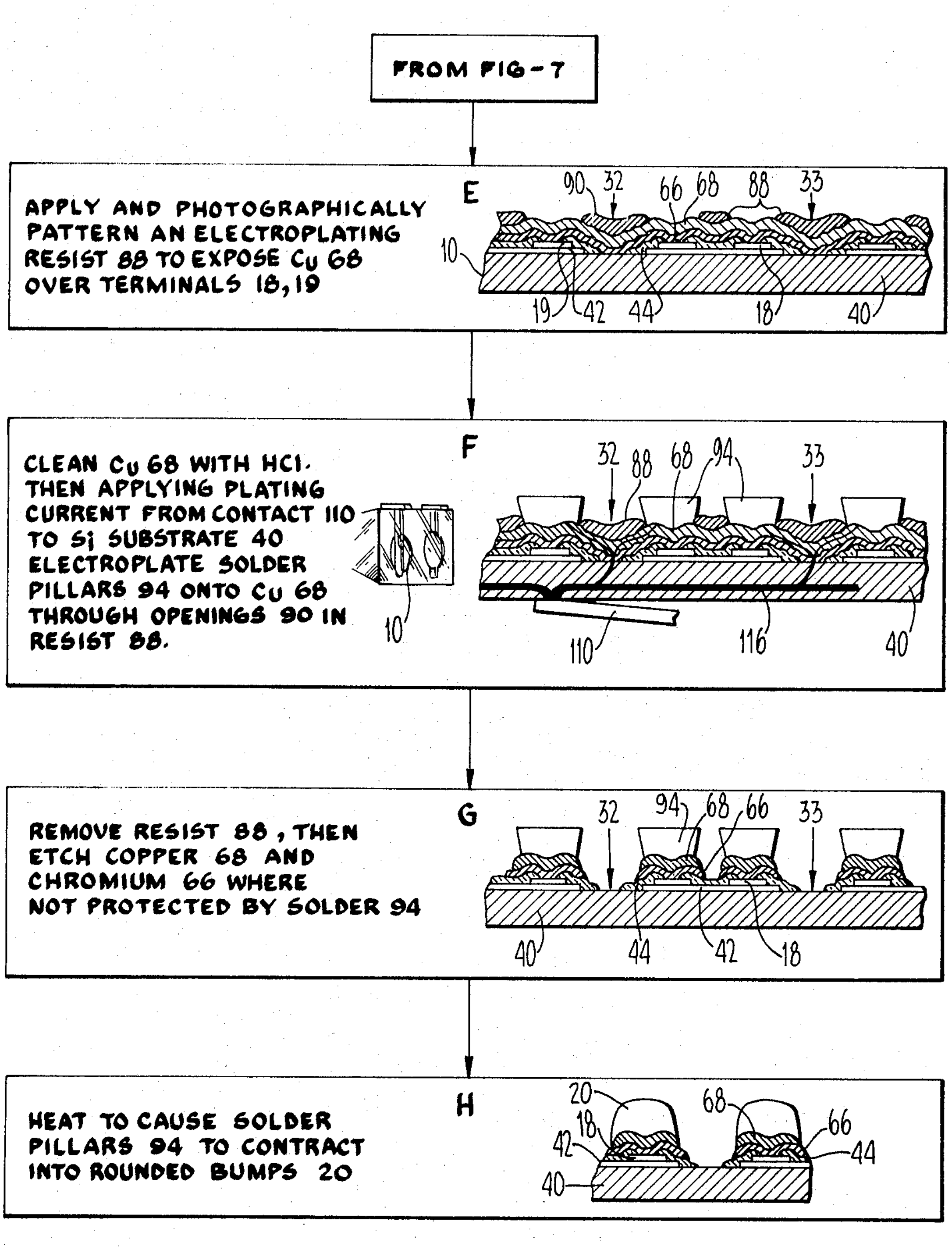

FIGS. 7 and 8 constitute a flow diagram of our process. At step A, FIGS. 7 and 8, we form and metallize a plurality of microcircuits 12 on a semiconductor, such as the silicon wafer 10 of FIG. 1. Two vertical arrows 32 and 33 mark two adjacent positions at which scribe marks, or scores, 14 (FIG. 2) will be made for separating the wafer 10 into chips. These scribe positions 32 and 33 lie between individual circuits 12, FIG. 1. The extent of a single chip-to-be having terminals 18 is indicated by a bracket 38. Other terminals 19 are shown on adjacent chips-to-be. These terminals are insulated from the silicon substrate 40 by an insulating layer 42. Other details of the microcircuits are omitted. Although intended to be later separated into individual chips, as in FIG. 2, the wafer 10 is preferably kept intact during the steps of FIGS. 7 and 8.

At step B in FIGS. 7 and 8, we form on the patterned, metallized face of wafer 10, a layer 44 of calcium magnesium aluminosilicate glass by radio frequency sputtering in argon at a low pressure of $2\times10^{-2}$ torr ($2\times10^{-2}$ mm. of mercury). Specifically, for the layer 44 we may use a glass sold by Owens Illinois, Inc., under their designation "Kimble EE-9." Depending on the thickness of the underlying metallized interconnects, the layer 44 may be made about 5,000 to 15,000 angstroms thick (0.5 to 1.5 microns, or 0.5 to $1.5\times10^{-6}$ meter).

Figure 9:
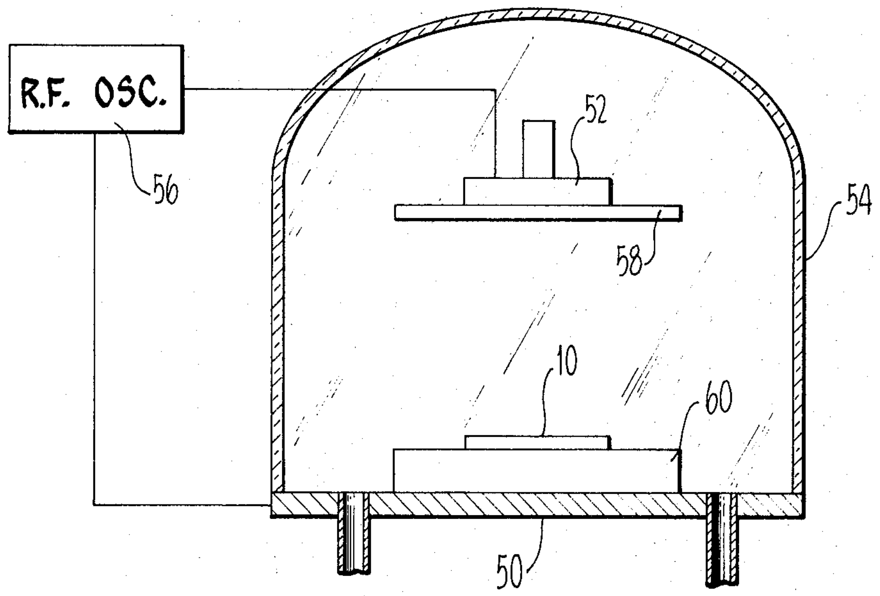
FIG. 9 is a partially diagrammatic view of apparatus for sputtering glass.

This sputtering may be performed in known apparatus arranged generally as indicated in FIG. 9. There a radio frequency field is generated between a base 50 and an electrode 52 in a bell jar 54 by an oscillator 56. A plate 58 composed of the glass of the desired composition in this field is bombarded by ionized atoms of low-pressure argon within the bell jar 54 so that glass is sputtered from its surface onto the wafer 10. Conveniently, the glass plate 58 is supported on, and below, the electrode 52, and the wafer 10 rests on a support 60 below it.

Next, using known techniques, as shown at step C in FIGS. 7 and 8, we apply and develop a photoresist over the glass coat 44, and etch away the glass coat to leave openings 46 at terminal positions over the terminals 18 and 19 and also openings 48 over the scribe positions 32 and 33. These scribe locations lie between, or at the borders of, the separate microcircuits on the wafer 10, preferably at the positions at which the scribe lines 14, FIG. 2, are to be made, so that removal of the glass 44 at these locations exposes the silicon of the substrate 40.

Figure 10:
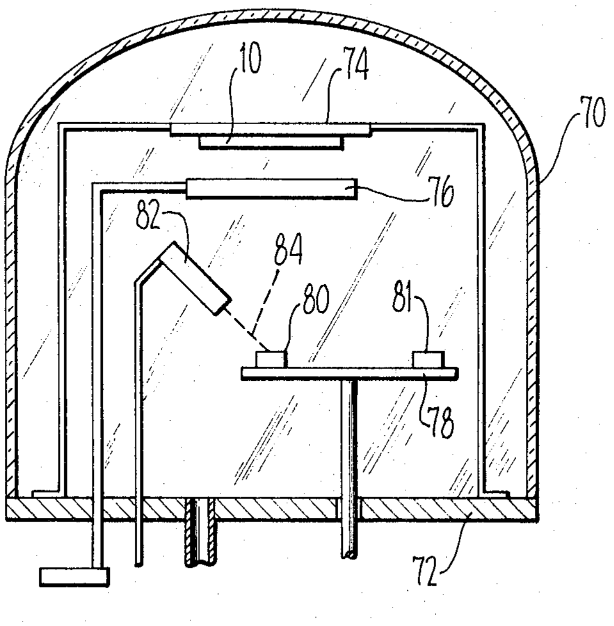
FIG. 10 is a partially diagrammatic view of an apparatus for vacuum deposition of metals.

At step D, FIGS. 7 and 8, a conducting and bonding metal layer 64 is then deposited over the whole of the wafer. This layer 64 may consist of a layer 66 of chromium 200 angstroms thick followed by a layer 68 of copper 3,000 angstroms thick, each deposited by known techniques from a metal vapor in an otherwise vacuum environment by means of apparatus arranged generally as indicated in FIG. 10. There, a bell jar 70 and a base 72 enclose a platen 74 for supporting the wafer 10, a movable shutter 76 for shielding the wafer 10, a revolvable table 78 carrying crucibles 80 and 81 containing chromium and copper, respectively, and an electron gun 82 for delivering an electron stream 84 for vaporizing the metal in the crucibles 80 and 81. With the chamber evacuated to about $10^{-6}$ torr or less, and the shutter 76 shielding the wafer 10, the crucible 80, containing chromium, is aligned with the gun 82, and the gun is energized for evaporating chromium. After an initial period of energization for dissipating contaminants from the surface of the chromium in the crucible, the shutter 76 is swung away to permit metal thrown from the crucible 80 to impinge on the wafer 10. After the necessary time for depositing the 200 angstrom layer 66 of chromium, which time may be about forty seconds, the shutter 76 is swung under the wafer 10 to stop the deposition, and the gun 82 is deenergized. Then, promptly and without reducing the vacuum, the table 78 is rotated to bring the crucible 81 containing copper under the gun 82, and the copper is vaporized and deposited similarly to form the layer 68. Conveniently, the intensity of operation of the electron gun 82 may be chosen to deposit the 3,000 angstrom layer of copper 68 in 30 seconds. The copper is deposited in the same pumpdown as the chromium, because, if exposed to the oxygen or water vapor of the air, the chromium surface would become passivated by chromium (III) oxide ($Cr_2O_3$), which is electrically insulating, and which would impair the adhesion of the copper to the chromium. The chromium layer 66 of this step D, FIGS. 7 and 8, seals to the glass layer 44 and provides a good bond and electric contact to the terminals 18 and 19 and also a good contact to the silicon substrate 40 at the scribe locations 32 and 33.

The terminals 18 and 19 may conveniently be made of aluminum, chromium, molybdenum, tungsten, copper, or silver. If the terminals 18 and 19 are made of aluminum, the chromium layer 66 must be at least 1,500 angstroms thick so as to form, in addition, a diffusion barrier between the aluminum and copper. The copper layer 68 is applied for its solderability. Furthermore, in the chromium-copper system, there are no intermetallic compounds, and the solid solubilities of chromium in copper, and of copper in chromium, are very small. Consequently, failure-causing, brittle intermetallics are prevented from forming in this system.

In step E, FIGS. 7 and 8, an adherent mask 88 of electroplating resist is applied over the whole wafer to expose the copper layer 68 only at positions over the terminals 18 and 19. This mask 88 may be formed and photographically developed by known techniques. The openings 90 in the resist layer 88 are slightly larger than the openings below them in the glass layer 44.

In step F, FIGS. 7 and 8, we treat the wafer 10 with a dilute solution of hydrochloric acid (1.2 molar) to remove oxides from the surface of copper 68 and then electroplate solder onto the copper areas that are exposed through openings 90 in the layer 88 of resist, to form solder pillars 94 over the terminals 18, 19. The solder may consist of 0 to 5 percent by weight (zero to 8.41% atomic) of tin, and 100 to 95 percent by weight (100 to 91.59% atomic) of lead. The copper layer 68, which is much thinner than the solder pillars 94 must be prevented from dissolving into the tin of the solder during subsequent reflow. Therefore, a very high lead-content solder is chosen because of the extreme immiscibility of copper and lead. The solder may contain a small amount of tin to aid in the wetting of the copper layer 68.

Figure 11:
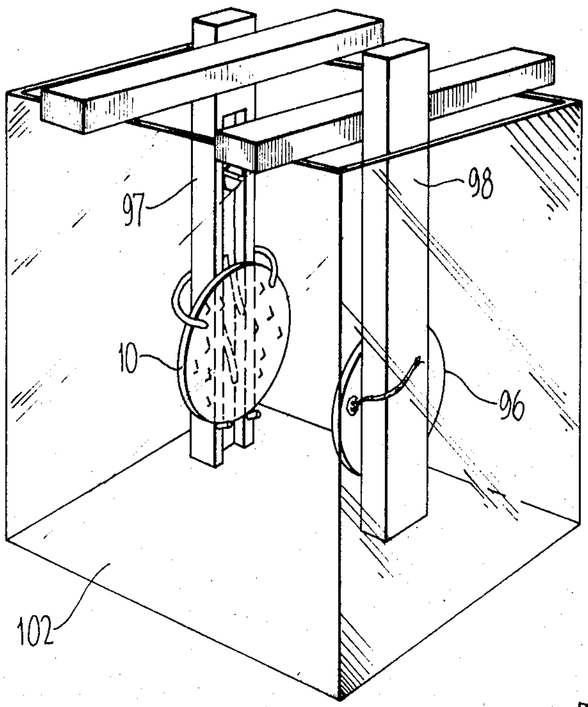
FIG. 11 is a partially diagrammatic pictorial view of apparatus for electroplating solder onto connector sites of microcircuits.
Figure 12:
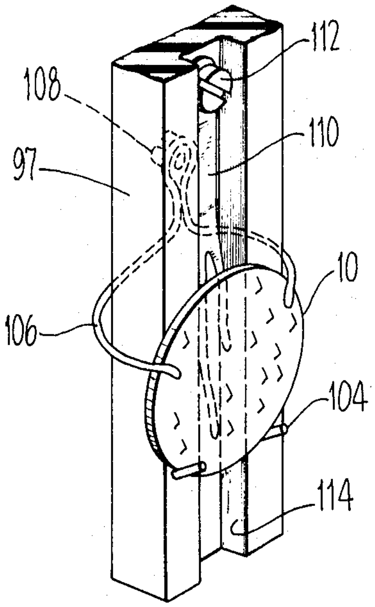
FIGS. 12 and 13 are details of the apparatus of FIG. 11.
Figure 13:
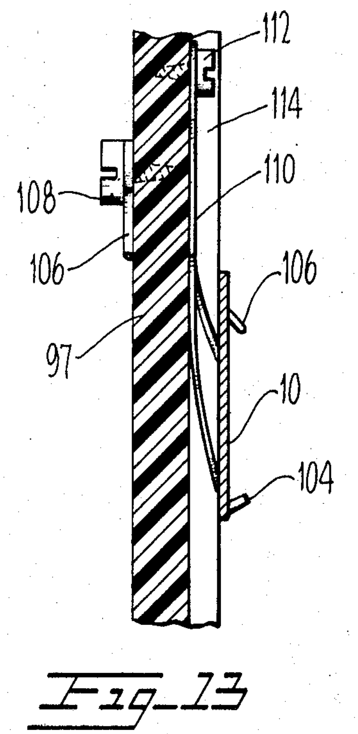

The electroplating may be performed with the apparatus of FIGS. 11 to 13. In FIG. 11, the wafer 10 and an anode 96 are fastened to insulating supports 97 and 98 which are hung in a jar 102 containing a plating bath consisting essentially of an aqueous solution of tin and lead tetrafluoroborates ($Sn(BF_4)_2$ and $Pb(BF_4)_2$) and tetrafluoroboric and boric acids ($HBF_4$ and $H_3BO_3$), as described in Bulletin TB–38353 of the Allied Chemical Corporation, General Chemical Division. The plating current is controlled to plate about 0.0015 inch of solder in 30 minutes.

As seen in FIGS. 12 and 13, the wafer 10 is held on the insulating support 97 by two pegs 104 and by spring arms 106 fastened at 108. A contact spring 110, fastened at 112, lies in a groove 114 of the insulating support 97 and bears against the back of wafer 10 to conduct plating current to the substrate 40 of wafer 10 as indicated in step F of FIGS. 7 and 8.

By providing distributed electric connections between the chromium-copper bonding-and-conducting layer 66, 68 and the silicon substrate 40 at the chip-border positions, such as 32, 33, we improve the electric conductance to the electroplating sites over the terminals 18 and 19. As shown in step F of FIGS. 7 and 8, plating current, indicated by dark bands 116, flows principally from the contact spring 110, through the silicon substrate 40 to the scribe locations such as 32, 33, up through the chromium layer 66 and into the copper layer 68 at those locations, and from each such location to the nearest plating site. Although there are many other paths, the bands 116 indicate the paths of least resistance, which will carry most of the plating current.

The conductance of the 3,000 angstrom layer 68 of copper is about 100 times that of the 200 angstrom layer 66 of chromium, so that the copper layer supplies the principal conductance of layer 66, 68 and carries most of the plating current. The conductance of the 0.010 inch thick, silicon substrate 40 is about 25 times that of the copper layer 68 so that the electric resistance encountered by the plating current between the contact spring 110 and the plating sites is about 5 percent of the resistance that would be imposed if the copper layer 68 alone were distributing the plating current to the plating sites from such a contact, as in the apparatus shown and described in our copending application previously referred to.

At step G, FIGS. 7 and 8, the mask 88 of photoresist is dissolved to expose most of the copper layer 68. Then the exposed parts of the metal layers 68 and 66 are dissolved in suitable etchants. In this operation, the solder pillars 94 protect the parts of the copper and chromium layers 66 and 68 beneath them.

At this stage, as shown at step G, FIGS. 7 and 8, the wafer 10 has the perforate glass coat 44, and over the terminals 18, 19 are the small padlike remnants of the layers 66 and 68 and the solder pillars 94. The pieces of the chromium layer 66 overlie the edges of the openings in the glass layer 44 and remain sealed thereto.

Then, at step H, FIGS. 7 and 8, the wafer 10 is placed in a furnace containing an inert or reducing atmosphere and heated to bring the solder pillars 94 at least to their liquidus temperature so that they melt. In the melted condition, surface tension draws the solder into rounded mounds 20. These mounds may be, for example, 0.003 to 0.006 inch in diameter and correspondingly 0.003–0.0045 to 0.006–0.009 inch tall.

Our improved method provides paths of high conductivity for distributing the plating current to the plating sites over the terminals of the microcircuits, for improving the uniformity of deposition of solder on the separate sites, for thereby providing a more uniform and reliable product.

We claim:

1. The steps in a method of forming bumps of solder on terminal areas of integrated circuit chips for mounting said chips on, and electrically connecting them to, carrier modules, which steps comprise:

a. providing a wafer comprising a planar, conductive substrate and a plurality of circuits thereon distributed suitably for the fragmentation of said wafer into chips each having a circuit element and terminals, b. forming on said wafer, a refractory insulating coat having openings for exposing said terminals and having also openings distributed over said wafer for exposing distributed areas of said substrate, c. forming over said wafer including said insulating coat, a thin conducting layer for making adherent electrically conductive bonds to said terminals, and for also making electrically conducting contact to said substrate through said openings and thereby electrically interconnecting said terminals and said distributed areas of said substrate, d. covering said conducting layer with a mask having apertures for exposing said conducting layer over said terminals, e. applying an electric connection to said substrate for thereby obtaining, for use in electroplating, conductive paths to the parts of said conductive layer that are exposed through said mask at said terminal areas, f. electroplating solder onto said parts of said conductive layer at said terminals and utilizing said electric connection and said conductive paths therefor, g. removing said mask and the exposed, unplated parts of said conductive layer, whereby each terminal includes a remnant of said conducting layer and a quantity of solder, and h. heating the electroplated solder on said terminals to cause said solder to contract into rounded bumps on said terminals.

2. The steps in a method of forming bumps of solder on terminal areas of integrated circuit chips for mounting said chips on carrier modules and for connecting the circuits of said chips to conductors of said carrier modules, which steps comprise a. applying a glass coating to a silicon wafer having a plurality of circuits thereon distributed suitably for the fragmentation of said wafer into chips, each having a circuit and terminals, said glass coating covering said circuits and terminal areas, b. forming openings in the glass coating to expose said terminals c. forming openings in said glass coating to expose areas of the silicon of said wafer at positions between the chips-to-be, d. depositing over said wafer a conducting layer of contact metal suitable for making adherent conductive connections to said terminals and to said silicon at said interchip areas, said metal layer covering said glass coating and forming electrically conductive bonds to said terminals and to the silicon exposed at said interchip areas, e. covering said layer of contact metal with a masking layer of electroplating resist and providing openings therein over said terminals for exposing said contact metal, f. applying an electric connection to the silicon of said wafer for thereby obtaining good electric conduction to said terminals of each chip through said silicon and through the bonds of said contact metal to the silicon at said interchip areas, g. utilizing said connection for electroplating solder onto the parts of said contact metal layer over said terminals so exposed through the openings in said resist, h. removing said resist and removing the then exposed, unplated parts of said contact metal layer, and i. heating the electroplated solder on said terminals to cause said solder to contract into a rounded bump on each terminal.

3. The method of claim 2 wherein said openings in said glass coating at said positions between the chips-to-be are formed by removing glass along substantially the lines along which the wafer is to be parted for forming separate chips.

4. The method of claim 2 wherein said terminals comprise a metal selected from the group consisting of aluminum, chromium, molybdenum, tungsten, copper or silver.

5. The method of claim 2 wherein said conducting layer is formed by first depositing a layer of chromium and then a layer of copper over said chromium with said copper having a thickness greater than said chromium.

6. The method of claim 2 wherein said solder comprises zero to five parts by weight of tin and 100 to 95 parts by weight of lead.

* * * * *